US 6,621,715 B2

(12) United States Patent
Kitadai

(10) Patent No.: US 6,621,715 B2
(45) Date of Patent: Sep. 16, 2003

(54) MOUNTING STRUCTURE AND METHOD FOR MOUNTING CARD-TYPE ELECTRONIC DEVICE AND FOR DISK DRIVE

(75) Inventor: Takashi Kitadai, Hamura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/098,356

(22) Filed: Mar. 18, 2002

(65) Prior Publication Data

US 2003/0002270 A1 Jan. 2, 2003

(30) Foreign Application Priority Data

Jun. 29, 2001 (JP) .......................................... 2001-199716

(51) Int. Cl.⁷ ................................................. H05K 7/12
(52) U.S. Cl. ....................... 361/801; 361/685; 361/807; 248/560
(58) Field of Search ................................ 361/685, 726, 361/737, 752, 753, 801, 807–810; 248/560, 561

(56) References Cited

U.S. PATENT DOCUMENTS 5,363,276 A * 11/1994 Crockett ..................... 361/752
5,402,308 A * 3/1995 Koyanagi et al. ........... 361/685
6,144,552 A * 11/2000 Whitcher et al. ........... 361/681
6,201,691 B1 3/2001 Nagarajan
6,496,362 B2 * 12/2002 Osterhout et al. .......... 361/685

FOREIGN PATENT DOCUMENTS

JP 2921662 4/1999

* cited by examiner

Primary Examiner—Jayprakash N. Gandhi
(74) Attorney, Agent, or Firm—Pillsbury Winthrop LLP

(57) ABSTRACT

Cushioning member that has a thickness greater than that of a card-type electronic device and is formed of an elastic material is detachably attached to the peripheral edge portion of the electronic device, thereby covering at least the four corner portions of the electronic device. The card-type electronic device having the cushioning member thereon is opposed to a seating surface of a seating portion, and a retaining member is located on the electronic device so as to face the seating surface. The cushioning member is clamped between the retaining member and the seating surface, and the card-type electronic device is held on the seating portion by the cushioning member.

11 Claims, 4 Drawing Sheets

MOUNTING STRUCTURE AND METHOD FOR MOUNTING CARD-TYPE ELECTRONIC DEVICE AND FOR DISK DRIVE

CROSS-REFERENCE TO RELATED APPLICATIONS

This application is based upon and claims the benefit of priority from the prior Japanese Patent Application No. 2001-199716, filed Jun. 29, 2001, the entire contents of which are incorporated herein by reference.

BACKGROUND OF THE INVENTION

1. Field of the Invention

The present invention relates to a mounting structure and a method for mounting and holding a card-type electronic device in a predetermined position.

2. Description of the Related Art

Modern electronic apparatuses, such as personal computers, use various electronic devices for expansion, storage, etc. A card-type hard disc drive (hereinafter referred to as HDD) for use as one such electronic device is screwed directly or indirectly to a seating portion within the case of a personal computer by utilizing tapped holes in the base of the HDD. Alternatively, the HDD is fixed by means of a fixing member that is screwed to the case. In either case, vibrational shock that acts on the HDD can be reduced by placing a cushioning member of an elastic material between the HDD and the seating portion of the case or between the HDD and the fixing member.

Usually, the cushioning member includes a plurality of cushioning members that are arranged at the four corners of the HDD, on its upper and lower surfaces, and near screw junctions. In mounting the HDD on the case side, therefore, the cushioning members must be located between the HDD and the case or between the HDD and the fixing member. Thus, mounting or removing the HDD is troublesome.

In the case where the HDD is not fixed directly to the seating portion side, as in the case of an ultra-compact HDD, it can be easily mounted and removed from the case side of the personal computer. On the other hand, in this case, adequate protection can not be provided for the HDD against external vibration.

BRIEF SUMMARY OF THE INVENTION

The present invention has been contrived in consideration of these circumstances, and its object is to provide a mounting structure and a method for mounting a card-type electronic device, in which the electronic device can be attached and detached with ease and protected against external vibrational shock.

In order to achieve the above object, a mounting structure according to an aspect of the present invention is used to mount and hold the card-type electronic device having a connector on one side edge portion thereof. The mounting structure comprises: a cushioning member formed of an elastic material, detachably attached to the card-type electronic device so as to cover at least the four corner portions of the electronic device, and having a thickness greater than that of the electronic device;

a seating portion having a seating surface opposed to a surface of the card-type electronic device; and a retaining member opposed to the seating surface and clamping the cushioning member on the card-type electronic device between the seating surface and the retaining member to hold the electronic device in position.

Further, a mounting method for a card-type electronic device according to another aspect of the invention comprises: detachably attaching cushioning member, having a thickness greater than that of the card-type electronic device and formed of an elastic material, to the electronic device and covering at least the four corner portions of the electronic device; opposing the card-type electronic device having the cushioning member thereon to a seating surface of a seating portion; and opposing a retaining member to the seating surface and clamping the cushioning member between the retaining member and the seating surface to hold the card-type electronic device on the seating portion.

According to the mounting structure and mounting method for a card-type electronic device arranged in this manner, a card-type electronic device can be attached to and detached from the seating portion in a manner such that the detachable cushioning member is attached to the peripheral edge portion of the electronic device. In installing or removing the card-type electronic device, therefore, neither of the cushioning members need be permanently fixed to the seating portion, enabling the card-type electronic device to be installed or removed with ease.

Further, the card-type electronic device is fixed by means of the cushioning member that is held between the seating portion and the retaining member. If vibrational shock acts on the seating portion, therefore, the cushioning effect of the cushioning member can reduce the shock to the electronic device.

Furthermore, the card-type electronic device can be securely fixed in a predetermined position by means of the cushioning member. The shock-absorbing properties of the cushioning member, which is formed of an elastic material such as rubber, can prevent the electronic device from being dislocated.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

A personal computer that is furnished with a mounting structure for a card-type electronic device according to an embodiment of the present invention will now be described with reference to the accompanying drawings.

Figure 1:
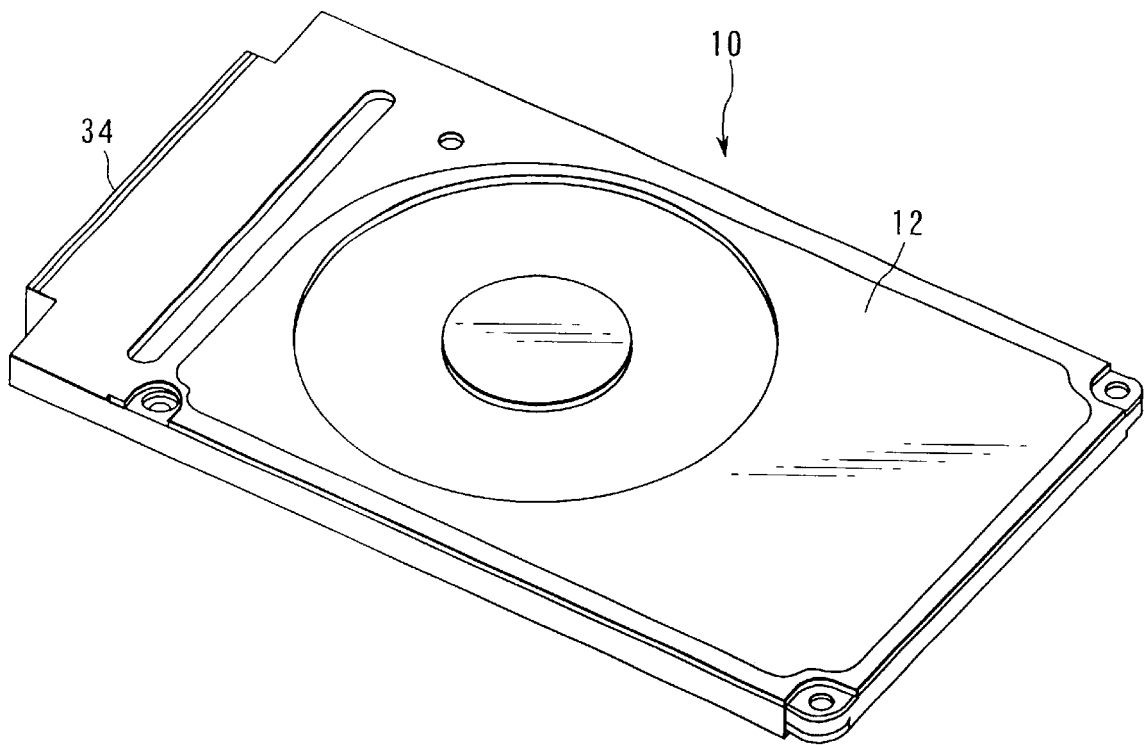
FIG. 1 is a perspective view showing an HDD mounted by means of a mounting structure according to an embodiment of the present invention.
Figure 2:
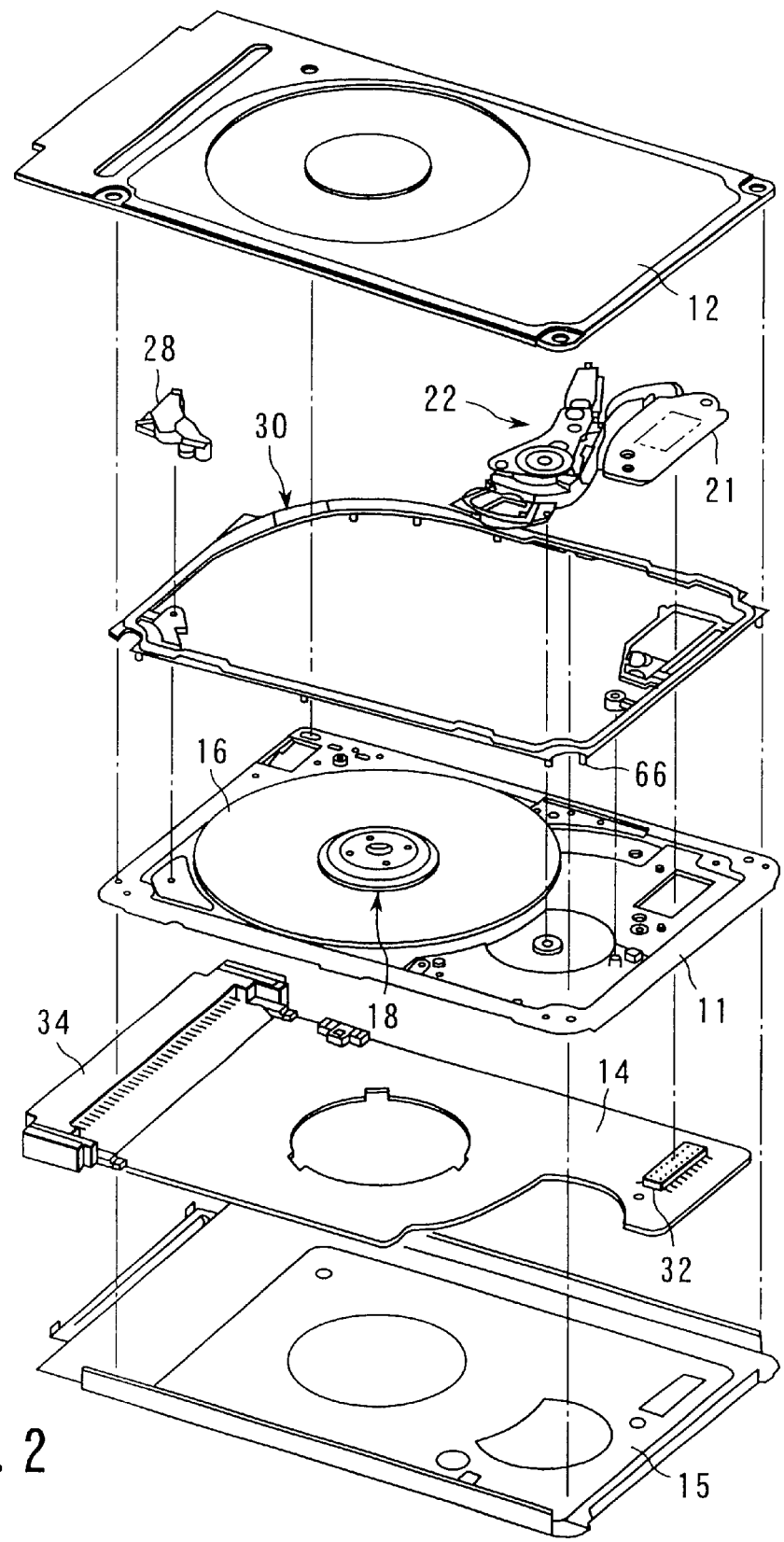
FIG. 2 is an exploded perspective view of the HDD.

An HDD for use as the card-type electronic device will be described first. As shown in FIGS. 1 and 2, an HDD 10 is in the form of a flat, substantially rectangular card with a thickness of 5.0 mm. The HDD 10 comprises a base 11 formed of a rectangular metal plate, a platelike top cover 12 that covers the upper surface of the base 11, a printed circuit board 14 provided on the bottom side of the base, and a bottom cover 15 that covers the bottom side of the printed circuit board and the base. These elements are stacked in layers to form a card-type structure as a whole. A frame-shaped seal 30 for airtightly-sealing the inside of the base 11 is interposed between the base 11 and the top cover 12.

On the base 11 are provided a 1.8-inch magnetic disc 16 that serves as an information recording medium, a spindle motor 18 for use as a drive motor for supporting and rotating the magnetic disc, and a plurality of magnetic heads for writing to/reading information from the magnetic disc. On the base 11 are further provided a head actuator 22 that supports the magnetic heads for movement with respect to the magnetic disc 16, a voice coil motor (not shown) for rocking and positioning the head actuator, a ramped loading mechanism, an inertia latch mechanism 26, a substrate unit 21 having a head IC or the like, an air filter 28, etc.

The printed circuit board 14, which is provided on the outer surface of the bottom wall of the base 11, is mounted with a connector 32 that is connected to the substrate unit 21 and a connector 34 for connecting the HDD 10 to an external apparatus. The connector 34 projects from one side edge of the HDD.

Figure 3:
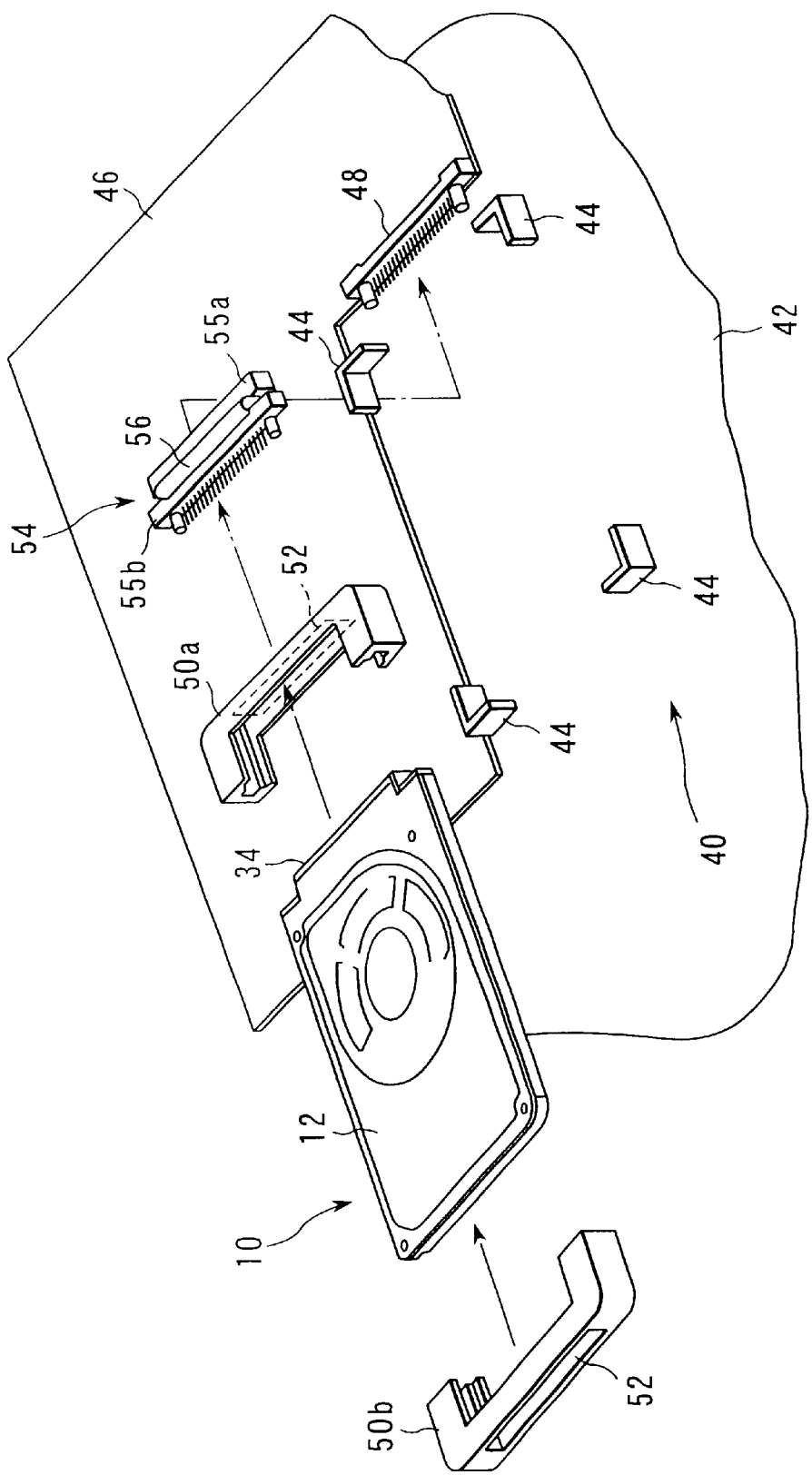
FIG. 3 is an exploded perspective view showing the mounting structure.
Figure 4:
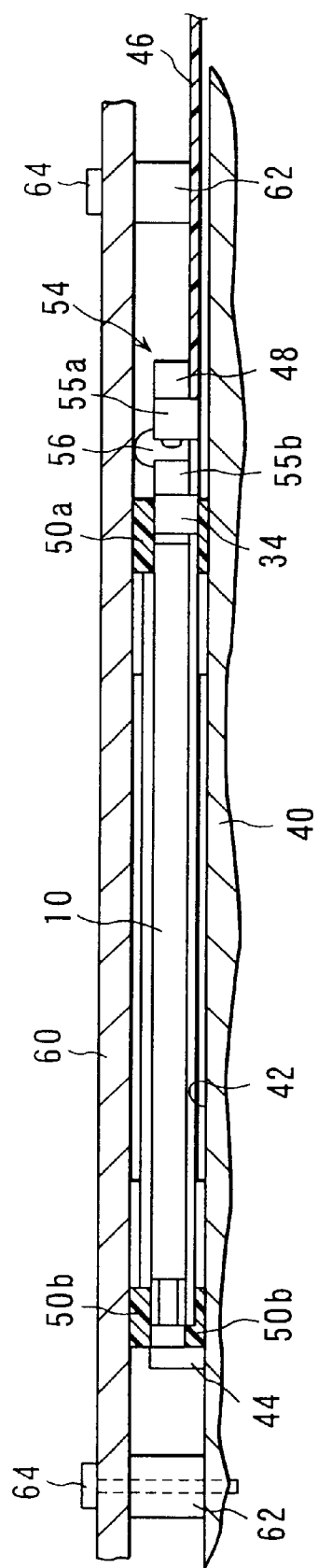
FIG. 4 is a sectional view showing the HDD mounted by means of the mounting structure.

As shown in FIGS. 3 and 4, a personal computer is furnished with the mounting structure for mounting and holding the HDD 10. More specifically, the personal computer comprises a seating portion 40 in a part of the case. The seating portion 40 has a flat seating surface 42. Four L-shaped positioning projections 44 protrude from the seating surface 42. The projections 44 are located so as to position the four corner portions of the HDD 10.

A main printed circuit board (hereinafter referred to as main PCB) 46 is provided in the case of the personal computer so as to adjoin and face the seating surface 42. A seating-side connector 48 is mounted on the main PCB 46 so as to face the seating portion 40.

Further, the mounting structure comprises first and second cushioning members 50a and 50b that are detachably attached to the peripheral edge portion of the HDD 10. The cushioning members 50a and 50b are formed of an elastic material such as rubber. The thickness of each cushioning member is greater than the thickest portion of the HDD 10.

The cushioning members 50a and 50b are of the same shape and are substantially U-shaped, to match the shape of the longitudinally opposite end edge portions of the HDD 10. Thus, the cushioning members 50a and 50b can be attached to the HDD to cover its four corner portions and the longitudinally opposite end edge portions.

Each of the first and second cushioning members 50a and 50b has an aperture corresponding to the connector 34 of the HDD 10. Accordingly, the first cushioning member 50a can be attached to either end edge portion of the HDD such that the connector 34 is exposed through the aperture 52.

Further, the mounting structure comprises a trunk connector 54, which connects the connector 34 of the HDD 10 and the seating-side connector 48, and a retaining member 60 (mentioned later). The trunk connector 54 includes a first connector 55a connected to the seating-side connector 48, a second connector 55b connected to the connector 34 of the HDD 10 through the aperture 52 of the first cushioning member 50a, and a flexible printed circuit board (hereinafter referred to as FPC) 56 that connects the first and second connectors.

In mounting the HDD 10 in the personal computer, the first and second cushioning members 50a and 50b are first attached to the longitudinally opposite end edge portions of the HDD 10, as shown in FIGS. 3 and 4. Subsequently, the HDD 10 is placed on the seating surface 42 of the seating portion 40 so as to be aligned with the positioning projections 44. At the same time, the first connector 55a of the trunk connector 54 is connected to the seating-side connector 48, while the second connector 55b is connected to the connector 34 of the HDD 10 through the aperture 52 of the first cushioning member 50a. Thereupon, the HDD 10 is located in a predetermined position on the seating portion 40, and is connected electrically to the main PCB 46 by means of the trunk connector 54 and the seating-side connector 48.

Thus, the first cushioning member 50a has the aperture 52 through which the connector 34 is exposed, so that the connector 34 of the HDD 10 and the connector 48 of the personal computer can be connected and disconnected without disengaging the first and second cushioning members 50a and 50b from the HDD 10. Since the first and second cushioning members 50a and 50b have the same shape, moreover, they may be interchange.

Then, the retaining member 60, in the form of a plate, is located over the seating portion 40 and the HDD 10. The case of the personal computer can be used as the retaining member 60, for example. Further, the retaining member 60 has a plurality of bosses 62 that project toward the seating surface 42 and surround the seating portion 40. It is to be desired that the height of each boss 62 is greater than the thickness of the HDD 10 and less than the thickness of each of the cushioning members 50a and 50b.

The retaining member 60 is secured to the seating portion 40 by means of a plurality of screws 64, and the bosses 62 are therefore brought into contact with the seating surface 42. Thereupon, the retaining member 60 is opposed parallel to the seating surface 42 at a given distance therefrom and attached to the HDD 10. Further, the first and second cushioning members 50a and 50b that are thicker than the HDD 10 are held and fixed between the retaining member 60 and the seating surface 42. Thus, the HDD 10 is mounted on the seating portion 40 by means of the first and second cushioning members 50a and 50b.

Although the seating surface 42 and the retaining member 60 are intimately in contact with the first and second cushioning members 50a and 50b in this mounted state, they can never be directly in contact with the HDD 10.

According to this mounting structure and mounting method arranged in this manner, the HDD 10 can be attached to and detached from the seating portion 40 of the personal computer with the first and second detachable cushioning members 50a and 50b are attached to the HDD 10. In installing or removing the HDD 10, therefore, neither of the cushioning members need be permanently fixed to the seating portion, enabling the HDD 10 to be installed or removed with ease.

Further, the HDD 10 is fixed by means of the first and second cushioning members 50a and 50b that are held between the seating portion 40 and the retaining member 60. If vibrational shock acts on the seating portion 40, therefore, the cushioning effect of the cushioning members can reduce the shock to the HDD 10. In consequence, the HDD can be better protected from damage. Since the first and second cushioning members 50a and 50b are mounted so as to surround the peripheral edge portion of the HDD 10, moreover, they can produce a high cushioning effect.

Furthermore, the HDD 10 can be securely fixed in the predetermined position by means of the first and second cushioning members 50a and 50b. The shock-absorbing properties of the cushioning members, which are formed of an elastic material such as rubber, can restrain the HDD from being dislocated.

Accordingly, there can be provided a mounting structure and a method of mounting a card-type electronic device, in which the electronic device can be attached and detached with ease and protected against external vibrational shock.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

According to the foregoing embodiment, for example, the first and second cushioning members are attached to the longitudinally opposite end edge portions of the HDD 10. Alternatively, however, they may be shaped to cover the long-sides and two pairs of corner portions of the HDD and be attached to the long-sides of the HDD. Further, the cushioning members may be replaced with a single frame.

The bosses that regulate the space between the retaining member and the seating surface may be provided on the seating surface side, or they may be replaced with suitable spacers. Further, the present invention is not limited to the method of mounting the HDD and it is also applicable to any other card-type electronic device such as a memory card, a modem card, etc.

What is claimed is:

1. A mounting structure for mounting and holding a card-type electronic device having four corner portions and a connector on one side edge portion thereof, comprising:
    first and second cushioning members formed of an elastic material, detachably attached to a peripheral edge portion of the card-type electronic device and covering each two corner portions of the electronic device, the first and second cushioning members having a thickness greater than that of the card-type electronic device, and the first cushioning member having an aperture opposed to the connector of the card-type electronic device;
    a seating portion having a seating surface opposed to a surface of the card-type electronic device; and
    a retaining member opposed to the seating surface and clamping the first and second cushioning members on the card-type electronic device between the seating surface and the retaining member to hold the electronic device in position.

2. A mounting structure for a card-type electronic device according to claim 1, which further comprises a seating-side connector located adjacent to the seating portion and a trunk connector connecting the connector of the card-type electronic device mounted on the seating portion to the seating-side connector, the trunk connector having a first connector connected to the seating-side connector, a second connector connected to the connector of the card-type electronic device through the aperture of the first cushioning member, and a flexible printed circuit board connecting the first and second connectors.

3. A mounting structure for a card-type electronic device according to claim 1, wherein the first and second cushioning members have the same size and shape.

4. A mounting structure for mounting and holding a card-type electronic device having four corner portions and a connector on one side edge portion thereof, comprising:
    a cushioning member formed of an elastic material, detachably attached to the card-type electronic device so as to cover at least the four corner portions of the electronic device, and having a thickness greater than that of the electronic device;
    a seating portion having a seating surface opposed to a surface of the card-type electronic device, the seating portion having a plurality of positioning portions located on the seating surface and configured to position the card-type electronic device; and
    a retaining member opposed to the seating surface and clamping the cushioning member on the card-type electronic device between the seating surface and the retaining member to hold the electronic device in position.

5. A mounting structure for a card-type electronic device according to claim 4, wherein the cushioning member includes first and second cushioning members detachably attached to the peripheral edge portion of the card-type electronic device and covering each two corner portions of the electronic device.

6. A mounting structure for mounting and holding a card-type electronic device having four corner portions and a connector on one side edge portion thereof, comprising:
    a cushioning member formed of an elastic material, detachably attached to the card-type electronic device so as to cover at least the four corner portions of the electronic device, and having a thickness greater than that of the electronic device;
    a seating portion having a seating surface opposed to a surface of the card-type electronic device;
    a retaining member opposed to the seating surface and clamping the cushioning member on the card-type electronic device between the seating surface and the retaining member to hold the electronic device in position; and
    bosses provided on at least one of the seating portion and the retaining member and configured to regulate the space between the seating portion and the retaining member.

7. A mounting structure for mounting and holding a disk drive having four corner portions and a connector on one side edge portion of the disk apparatus, comprising:
    first and second cushioning members formed of an elastic material, detachably attached to a peripheral edge portion of the disk drive and covering each two corner portions of the disk drive, the first and second cushioning members having a thickness greater than that of the disk drive, and the first cushioning member having an aperture opposed to the connector of the disk drive;
    a seating portion having a seating surface opposed to a surface of the disk drive; and
    a retaining member opposed to the seating surface and clamping the first and second cushioning members on the disk drive between the seating surface and the retaining member to hold the disk drive in position.

8. A mounting structure for mounting and holding a disk drive having four corner portions and a connector on one side edge portion thereof, comprising:

a cushioning member formed of an elastic material, detachably attached to the card-type electronic device so as to cover at least the four corner portions of the disk drive, and having a thickness greater than that of the disk drive;

a seating portion having a seating surface opposed to a surface of the disk drive, the seating portion having a plurality of positioning portions located on the seating surface and configured to position the disk drive; and a retaining member opposed to the seating surface and clamping the cushioning member on the disk drive between the seating surface and the retaining member to hold the disk drive in position.

9. A mounting structure for mounting and holding a disk drive having four corner portions and a connector on one side edge portion thereof, comprising:

a cushioning member formed of an elastic material, detachably attached to the disk drive so as to cover at least the four corner portions of the disk drive, and having a thickness greater than that of the disk drive;

a seating portion having a seating surface opposed to a surface of the disk drive;

a retaining member opposed to the seating surface and clamping the cushioning member on the disk drive between the seating surface and the retaining member to hold the disk drive in position; and bosses provided on at least one of the seating portion and the retaining member and configured to regulate the space between the seating portion and the retaining member.

10. A method for mounting a card-type electronic device having a connector on one side edge portion thereof, comprising:

detachably attaching cushioning member, having a thickness greater than that of the card type electronic device and formed of an elastic material, to the electronic device and covering at least the four corner portions of the electronic device;

opposing the card-type electronic device having the cushioning member thereon to a seating surface of a seating portion; and opposing a retaining member to the seating surface and clamping the cushioning member between the retaining member and the seating surface to hold the card-type electronic device on the seating portion.

11. A method for mounting a disk drive having four corner portions and a connector on one side edge portion thereof, comprising:

detachably attaching cushioning member, having a thickness greater than that of the disk drive and formed of an elastic material, to the disk drive and covering at least the four corner portions of the disk drive;

opposing the disk drive having the cushioning member thereon to a seating surface of a seating portion; and opposing a retaining member to the seating surface and clamping the cushioning member between the retaining member and the seating surface to hold the disk drive on the seating portion.

* * * * *